United States Patent [19]
Etzkorn et al.

[11] Patent Number: 5,324,361
[45] Date of Patent: Jun. 28, 1994

[54] APPARATUS FOR COATING CAP-SHAPED SUBSTRATES

[75] Inventors: Heinz-Werner Etzkorn, Neu-Ansbach; Harald Krümmel, Mainz; Günter Weidmann, Armsheim; Volker Paquet, Mainz, all of Fed. Rep. of Germany

[73] Assignee: Schott Glaswerke, Mainz, Fed. Rep. of Germany

[21] Appl. No.: 900,716

[22] Filed: Jun. 18, 1992

[30] Foreign Application Priority Data
Jun. 19, 1991 [DE] Fed. Rep. of Germany ....... 4120176

[51] Int. Cl.⁵ ............................................. C23C 16/50
[52] U.S. Cl. .................................. 118/719; 118/715; 118/723 MW; 118/723 ME; 118/733
[58] Field of Search ............... 118/715, 719, 723 MW, 118/723 ME, 723 MR, 723 MA, 723 AN, 723 DC, 723 E, 733; 427/237

[56] References Cited
U.S. PATENT DOCUMENTS

| | | | |
|---|---|---|---|
| 3,335,024 | 8/1967 | Lopenski et al. | 427/237 X |
| 4,148,275 | 4/1979 | Benden et al. | 427/237 X |
| 4,539,934 | 9/1985 | Fujiyama et al. | 118/723 E |
| 4,545,328 | 10/1985 | Fujiyama et al. | 118/723 E |
| 5,154,943 | 10/1992 | Etzkorn et al. | 118/723 MW X |
| 5,176,924 | 1/1993 | Williams | 118/723 E X |

Primary Examiner—R. Bruce Breneman
Assistant Examiner—Jonathan D. Baskin
Attorney, Agent, or Firm—Millen, White, Zelano & Branigan

[57] ABSTRACT

To coat several cap-shaped substrates simultaneously in an economical way with the same and high quality, several coating chambers are connected into a cap coating station by a symmetrical gas line system with a common gas generator and by another gas line system with a common vacuum pump. The gas lines have a cross sectional area $Q_A(x)$ and a cross sectional form $Q_F(x)$ which as a function of the distance x from the gas generator or from the vacuum pump are substantially the same. In this way, the same flow conditions are assured in all coating chambers. The gas line systems can be formed by precision pipes or by a stack of solid plates, in which gas ducts are introduced by boring or milling. Several cap coating stations, which are connected by suitable symmetrical gas line systems with a common vacuum pump and a common gas generator, can be combined to form a unit.

23 Claims, 10 Drawing Sheets

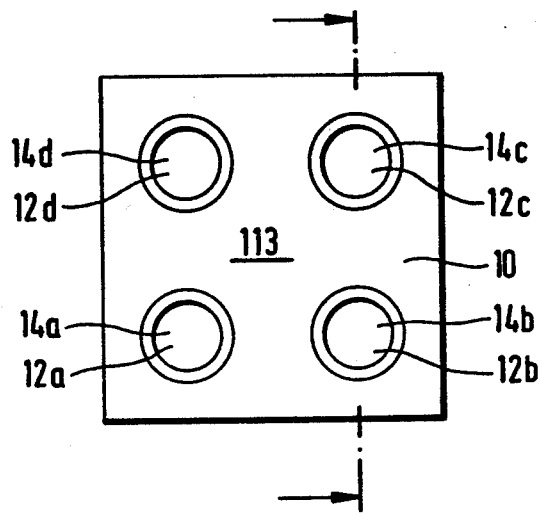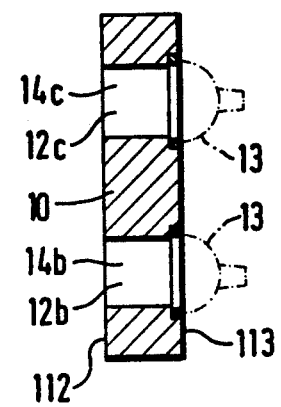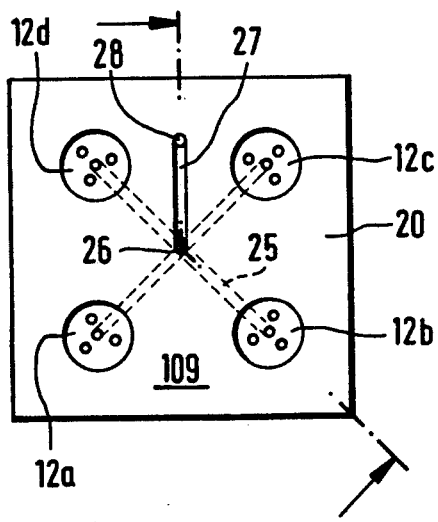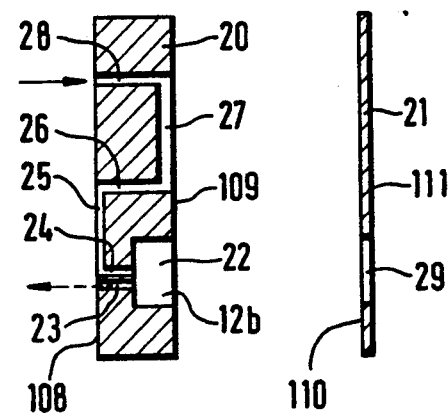

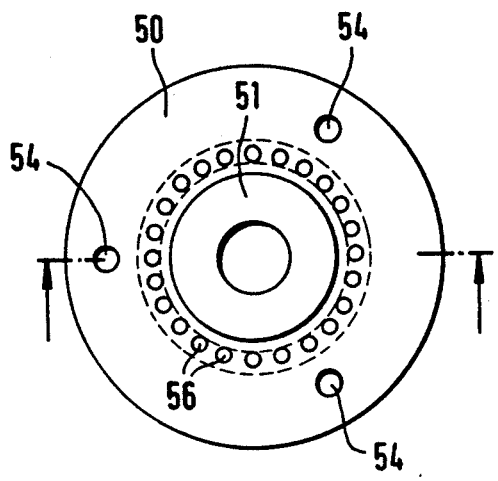
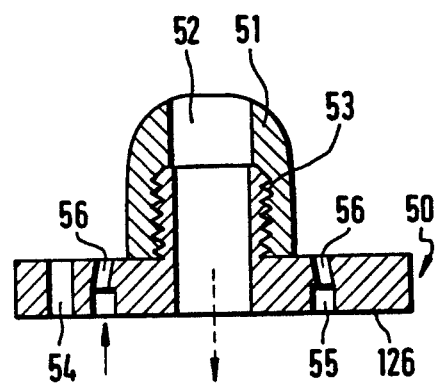
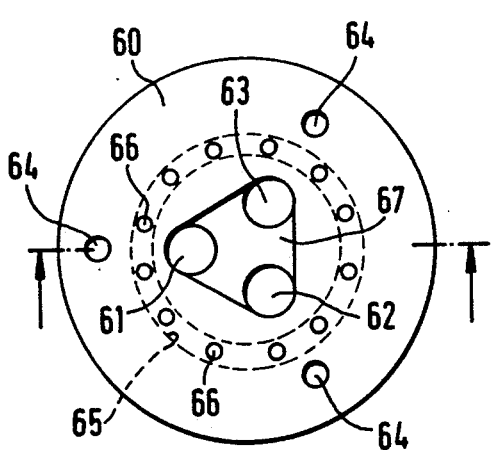
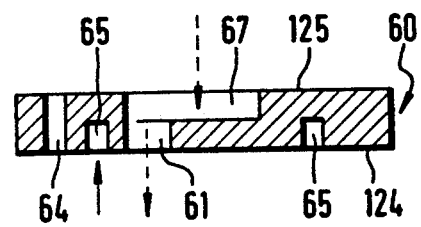

APPARATUS FOR COATING CAP-SHAPED SUBSTRATES

BACKGROUND OF THE INVENTION

The invention relates to apparatus for coating the inner surface of cap-shaped substrates with a dielectric layer system. More particularly, the invention relates to coating the inner surface of reflectors with a cold light mirror coating by using a coating chamber which is defined by the cap-shaped substrate and a receiver part assembled with the dielectric layer system disposed proximate the edges and connected gastight thereto. Moreover, the invention relates to such apparatus wherein a gas intake duct and a gas exhaust duct are connected by a receiver. A displacer is used having one or more ducts to define the gas layer to be reacted, and a plasma zone is reacted in the gas layer by being excited. The invention also relates to a unit for coating cap-shaped substrates, in which several cap coating stations are placed side by side.

Coating devices of the above-described type are known from DE-OS 4008405 in which several caps are placed side by side in a grid for coating with a plasma pulse process on a bottom plate of a receiver. To keep the reaction volume as small as possible, the caps are sunk in suitable indentations in the bottom plate. The coverplate of the receiver is provided with an arrangement of displacers corresponding to the arrangement of the indentations in the bottom plate, which dip into the cavities limited by the inner surfaces of the caps to be coated. In the sidewalls of the receiver, several gas exhaust openings are provided, by which the reaction gases, depleted of laminate, can be suctioned off by a vacuum pump. This device has the drawback that the gas flow inside the receiver, on the one hand, is asymmetrical for each cap and, on the other hand, differs from cap to cap, so that, depending on the position of the cap inside the receiver, the coating can be different. Since the production tolerances do not permit an exact matching of the indentation to the cap shape, the caps are not completely supported, and a gap forms between the outside of the cap and the indentation. This can cause coating of the outside wall of the cap.

To eliminate this undesired effect, another embodiment was proposed in DE-OS 4008405 in which the cap to be coated was joined with a unilaterally open vessel to a receiver. Although the undesired deposition of the reaction gases on the outer surface of the cap is avoided with such a device, no completely symmetrical gas flow control is achieved in the area of the cap because of the gas exhaust pipe. Another drawback of this device consists in the fact that only individual caps can be coated in succession. If several such devices are operated, the latter are equipped with a separate gas generator and a separate microwave device for generating plasma. The unit and operating costs are very high due to the addition of individual coating units.

SUMMARY OF THE INVENTION

Therefore, the object of the invention is to provide an apparatus with which several caps can be coated simultaneously in an economical way with uniform, high quality.

According to the invention, at least two coating chambers are placed side by side while forming a cap coating station, which cap coating station is connected by gas lines to a gas generator common for all coating chambers and to a common vacuum pump. The gas lines for the gas supply and the gas lines for the gas discharge, respectively forming a symmetrical gas line system. Both cross sectional area $Q_A(x)$ and cross sectional form $Q_F(x)$ of the gas lines are functions of distance x from the gas generator or from the vacuum pump which distances are basically the same. Distance x is to be understood as referring to a section along the gas lines from the gas generator to site x. By providing these measures, largely identical flow conditions are achieved in the individual coating chambers, so that the coating of the substrates coated in the cap coating stations exhibits equally high quality. A gas mass flow, which differs by at most ±3% from the average value of the total mass flow divided by the number of coating chambers, flows in each coating chamber.

Another advantage of the instant invention is the fact that separate mass flow regulators need not now be provided for each coating chamber, since, because of the branched symmetrical gas line system, only one mass flow regulator per gas in the gas generator is sufficient.

According to one embodiment of the invention, the symmetrical gas line systems can be formed by precision pipes, which exhibit low tolerances relative to their cross section.

Instead of a pipeline system, the gas line systems may take the form of gas ducts according to a special embodiment formed in at least one common solid plate. The receiver parts of the individual coating chambers are designed as recesses in the common plate.

The individual caps to be coated are not placed with their outer side in these recesses, as is the case in the prior art, but the caps are located on the edge of the recesses, so that the inner side of each cap to be coated is opposite the corresponding recess. In this way, individual coating chambers are made in the common solid plate. To assure a tight closing of the coating chambers, at least one sealing element is placed between the edge of the recesses and the cap to be coated.

Preferably, at least two solid plates are provided which are placed on top of one another, and the recesses for the formation of the coating chambers are introduced in at least one plate. Sealing elements, which can consist of sealing disks or sealing rings, are placed between the plates. Instead of sealing elements, at least one of the two surfaces of the plates can be provided in each case with an elastomer layer, whose thickness is to be adjusted according to the degree of flatness of the surface. The elastomer layer is preferably applied on the surface of the plate or plates, in which no ducts are incorporated.

The design of a cap coating station with several plates makes it possible to produce the gas ducts for the individual coating chambers exclusively by boring and/or milling into the surfaces of the plates. The ducts milled in the surface are limited by the adjacent plate or sealing element or by the elastomer layer of the adjacent plate. The design of the gas ducts in the individual plates by boring or milling offers the advantage of a high packing density of the feed pipes and discharge pipes, a great stability and a simple possibility for cleaning the entire pipe system. Another advantage consists in the fact that the ducts can be produced with great precision. In this way, a largely identical flow conductance for all ducts is achieved with the advantage that an additional adjustment, e.g., by blending, is unnecessary for uniform distribution of gases in the ducts and coating chambers.

The solid plates can consist of metal, such as, e.g., aluminum, high-grade steel or a plastic such as, e.g., teflon or PVDF and are provided, if necessary with a coating which is resistant to the gas mixture flowing therethrough. The sealing elements consist preferably of silicone rubber and exhibit at least partially a recess matched to the through-holes placed in the plates, to make possible the gas flow from one plate to the other plate. In the areas where ducts milled in the surfaces are present, the sealing elements or the elastomer coating seal these ducts relative to the adjacent plate.

Preferably, the coating chambers are placed on a circle to which the gas intake ducts and the gas exhaust ducts lead radially from the center of the cap coating station. The center is connected respectively with a main intake duct and a main exhaust duct. In this way, the flow route to the individual coating chambers have identical lengths and identical shapes. Since the reaction gas generally consists of two components, it is guaranteed that the mixing of the components exhibits no differences when reaching the individual coating chambers, which differences could result in an uneven coating of the caps.

According to a preferred embodiment, a total of four plates with three sealing disks placed between them are sufficient for the formation of a cap coating station exhibiting four coating chambers. The first plate, on which the caps to be coated are placed edgewise, has exclusively therethrough through-holes for the formation of the coating chambers. The second plate can have pocket boreholes identical with the through-holes of the first plate for completion of the coating chambers. There also exists the possibility to dispense with the pocket boreholes, wherein the surface areas of the second plate assigned to the through-holes of the first plate form the bottom of the coating chamber. In the pocket boreholes or in the surface areas, which form the bottom area of the coating chambers, other throughholes are provided for forming respectively a section for the gas intake ducts and the gas exhaust ducts. The sections of the gas intake ducts are connected with ducts introduced radially in the surface of the second plate, and these radially placed ducts end in a centrally placed section of the gas intake duct made as a through-hole and merge into a main intake duct introduced in the opposite surface of the second plate.

The third plate of the cap coating station has through-holes identical with the gas exhaust duct of the second plate, which end in gas exhaust sections respectively introduced radially in the surface.

The fourth plate is used as an end plate and exhibits the common main intake duct and the common main exhaust duct, which are connected to the common vacuum pump or the common gas source.

In general, since both laminates are selected so that for their production in the plasma-CVD process, especially PICVD process, only three different initial gases have to be made available. These gases are, for example, $O_2$, which is to be designated below as gas A, as well as, for example, $TiCl_4$ or $OSi_2(CH_3)_6$, which are designated as gases B and C and are added to gas A depending on the desired coating. In the formation of a layer system in the cap, gas combinations A plus B and A plus C are alternately conveyed into the coating chamber.

In the interest of an economical coating, the coating rate has to be high. To achieve the latter, a gas distribution device is placed between the symmetrical gas line system and the gas generator according to a preferred embodiment. This device exhibits a supply line for gas A and two independent lines for gases B and C, which end in the common feed pipe for gas A, where the thorough mixing of both respective gases then occurs. In the feed pipes for gases A and B, shutoff valves as well as a bypass pipe with another shutoff valve are provided.

If gas combination A plus B is desired, the gas line for gas C is shut off and gas C is conveyed through the open bypass pipe to the pump. If gas combination A plus C is desired, the valves are switched correspondingly in gas line B and the bypass pipe of gas line C is closed and the corresponding second valve is opened.

As valves, especially quick valves are used, which can be switched with times less than 0.2 seconds. By the diversion of the gas not desired in each case in the bypass pipe, the mass flow can be maintained. It is thus possible to adjust a mass flow regulator incorporated in the gas generator for gases A, B and C to a constant setpoint value. The drawback of the gas to be discarded in the meantime in each case is offset in that a quick change is possible without time loss, so that it is not necessary to wait until the gas mass flow again is close to the setpoint value, as would be the case if the gas mass flow had to be interrupted.

To assure the uniform distribution of the gas also in the coating chambers and thus to assure a steady quality of the coating, a nozzle insert is provided in the individual coating chambers on which the displacer is attached. This nozzle body preferably has a threaded extension on which the displacer can be screwed, or a cone, on which the displacer can be stacked. This offers the advantage that the displacer is adjustable in an axial direction to adjust a desired distance to the inner surface of the cap to be coated. The nozzle body is preferably designed as the overall cap coating station also made from several plates lying sandwichlike on one another. In this case, the ducts in the nozzle plates are designed for azimuthal gas flow control. The ducts are introduced in these nozzle plates just as in the plates of the cap coating station by boring and/or milling to achieve a high accuracy of the gas ducts. In this way, it is assured that the quality of the flow ducts in the nozzle body corresponds to that of the symmetrical gas line systems.

An especially good azimuthal gas flow control is achieved when a circular duct is provided in each nozzle plate. The circular duct is connected with the circular duct of the respective adjacent plate by several connecting ducts, which are attached in axial direction. So that the gas flow flowing from one nozzle plate to the next nozzle plate is divided in each case into two streams, these connecting ducts of adjacent plates are placed offset to one another. In addition to an optimal gas distribution in the circular ducts, as a result, an improvement of the thorough mixing of the gas components is also achieved.

According to a special embodiment, the number of connecting ducts increases from nozzle plate to nozzle plate in the direction of the cap-shaped substrate. The cross section of the connecting ducts is smaller from nozzle plate to nozzle plate, so that a homogeneous laminar flow in the coating station in the area of the cap surface to be coated is achieved. The gas depleted of reaction substances is then suctioned off by the central duct in the displacer, which extends through the nozzle plates to the gas exhaust duct of the respective coating chamber.

There also exists the possibility to supply the gas by the central duct in the displacer of the coating chamber and to remove the spent reaction gas by the connecting boreholes of the upper nozzle plate into the duct lying below, and from there, to feed it into the gas exhaust duct of the respective coating chamber.

The means to excite a plasma zone in several coating chambers, to save unit and operating costs, consist of a single microwave device, and preferably a microwave device to perform the PICVD process is selected. According to a special embodiment, this microwave device comprises a magnetron, common for all coating chambers of a cap coating station, with an assigned pulse generator.

According to an embodiment, a resonator box that can be lowered over the caps of a cap coating station is provided with a magnetron located in the center. This magnetron is connected to the assigned pulse generator.

According to another embodiment, a waveguide cross that can be lowered on the cap coating station over the cap-shaped substrates is provided with metal pipes and metal coupling pins, and the waveguide cross is connected by suitable connecting conduits to the common magnetron.

There also exists the possibility to provide each coating chamber individually with a magnetron with microwave energy, and for each magnetron, a pulse generator either a separate one or one for several magnetrons, is provided, which yields the high voltage pulse.

The throughput of the caps to be coated can be increased in an economical way, in that several cap coating stations according to the invention are placed in a cap coating unit. The cap coating stations assembled in a unit are in this case connected to a common gas generator or a common vacuum pump, so that the costs for the devices as a whole can be markedly lowered. The gas lines between the gas generator or the vacuum pump and the individual cap coating stations are designed in the same way as in a cap coating station. Symmetrical gas line systems are provided, and cross section area $Q_A(y)$ and cross section form $Q_F(y)$ of the gas lines as a function of distance y from the gas generator or from the vacuum pump are basically the same.

The gas lines can also consist of precision pipes.

According to a preferred embodiment, the cap coating stations are placed side by side on a one-part or multipart solid distributor plate. The multipart embodiment of this distributor plate offers the advantage that the supply ducts and suction ducts also can be produced exclusively by boring and/or milling in the surface of the distributor plate. Thus, the same standard is assured also in the feeding of the gas to the individual cap coating stations, as it is present in each cap coating station and in the individual coating chambers by the configuration according to the invention.

Preferably, the cap coating stations are combined into two groups, and each group is connected by its own supply ducts to the gas generator. Since the coating to be applied consists of a layer system, which is formed alternately from gas combination A plus B and gas combination A plus C, reversing valves are provided in the supply lines, which are connected with a corresponding control device, so that the cap coating groups can be supplied alternately with both desired gas mixtures.

In this case, the gas generator is designed so that it can simultaneously deliver gas types A and B to one cap coating group and gas types A and C to the other cap coating group. In the production of both interference layer systems, gases B and C are switched over to the respective other cap coating group, if the corresponding layers have just been applied. If the length of time required for the production of the layers, for which gases B and C are necessary, differs, then the gas, which is not needed at that time, is diverted into a bypass pipe and suitably an oxygen plasma is allowed to burn in the corresponding cap coating group. The advantage of this unit consists in the fact that up to 50% of the possibly expensive gases B and C can be saved. Another advantage consists in the fact that no interruption of the gas flow has to be performed, so that again a quick reversing and thus a quick coating of the caps is made possible.

But there also exists the possibility of feeding all cap coating stations respectively with the same gas mixture, and after a planned period of time switching over to the respective other gas mixture for the production of a layer takes place. For this purpose, a gas distribution device is provided, which operates in the same way as the gas distribution device described above for a cap coating station.

Upon further study of the specification and appended claims, further objects and advantages of this invention will become apparent to those skilled in the art.

BRIEF DESCRIPTION OF THE DRAWINGS

Advantageous configurations of the invention are explained in more detail below based on the drawings in which:

FIGS. 4a to 7b illustrate solid plates forming the cap coating station in top view and in section;

FIGS. 8a to 11b illustrate nozzle bodies consisting of several nozzle plates in top view and in section;

DETAILED DESCRIPTION

Figure 1:
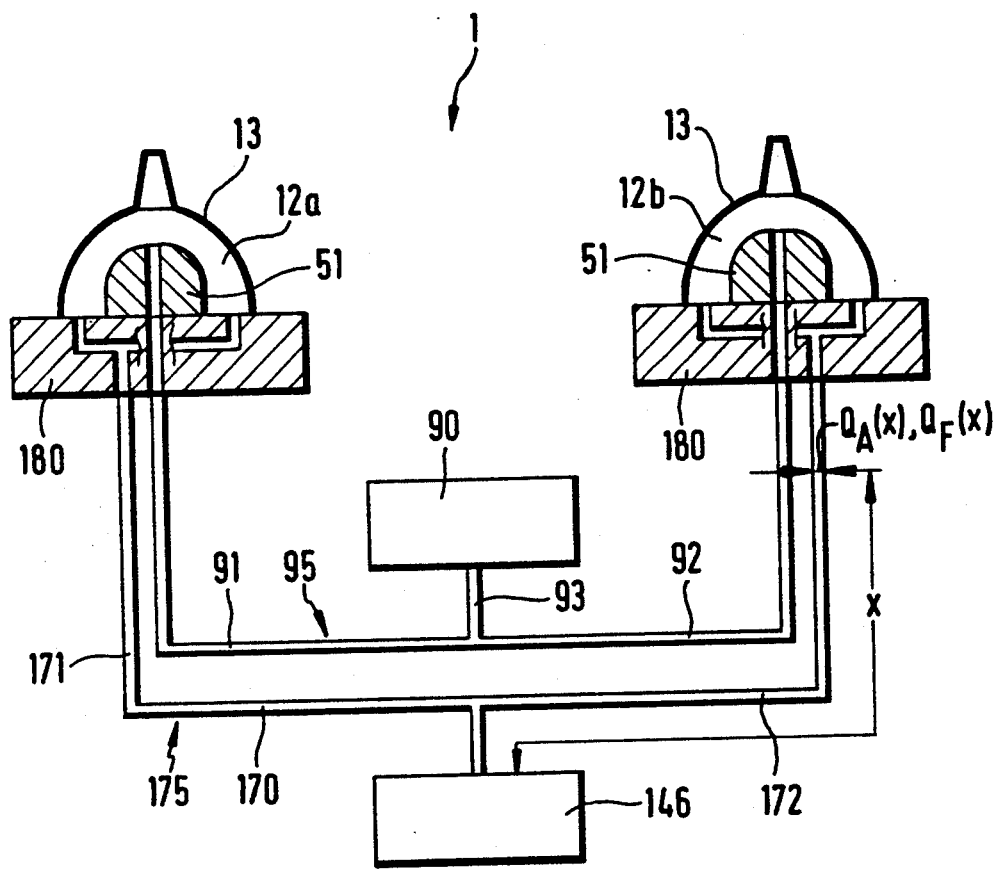
FIG. 1 is a diagrammatic representation of a cap coating station.

In FIG. 1, a cap coating station 1 is diagrammatically represented. Two coating chambers 12a and 12b are provided, which are formed respectively by cap-shaped substrate 13 and receiver part 180. Cap-shaped substrates 13 lie in a sealing manner on receiver parts 180, which are configured as branched gas line system that are described in more detail based on the following figures.

Gas displacers 51 are placed in coating chambers 12a and 12b. A symmetrical gas line system 175 with gas lines 170, 171 and 172 leads from a gas generator 146, which also exhibits the corresponding mass flow regulator, to individual receiver parts 180. To suction off the spent coating gases, a symmetrical gas line system 95 with gas lines 91, 92 and 93, which lead from receiver parts 180 to a common vacuum pump 90, is also provided. Cross sectional area $Q_A(x)$ and cross section form $Q_F(x)$ are basically of equal size for the gas lines with same distance x from the gas generator to make the same flow conditions in coating chambers 12a and 12b. Distance x is drawn in FIG. 1 relative to gas lines 170, 172.

Symmetrical gas line systems 95 and 175 represented in FIG. 1 are produced from precision pipes. Receiver parts 180 can be formed by nozzle body 9, as it is represented in FIG. 2 and FIGS. 8a to 11b.

Figure 2:
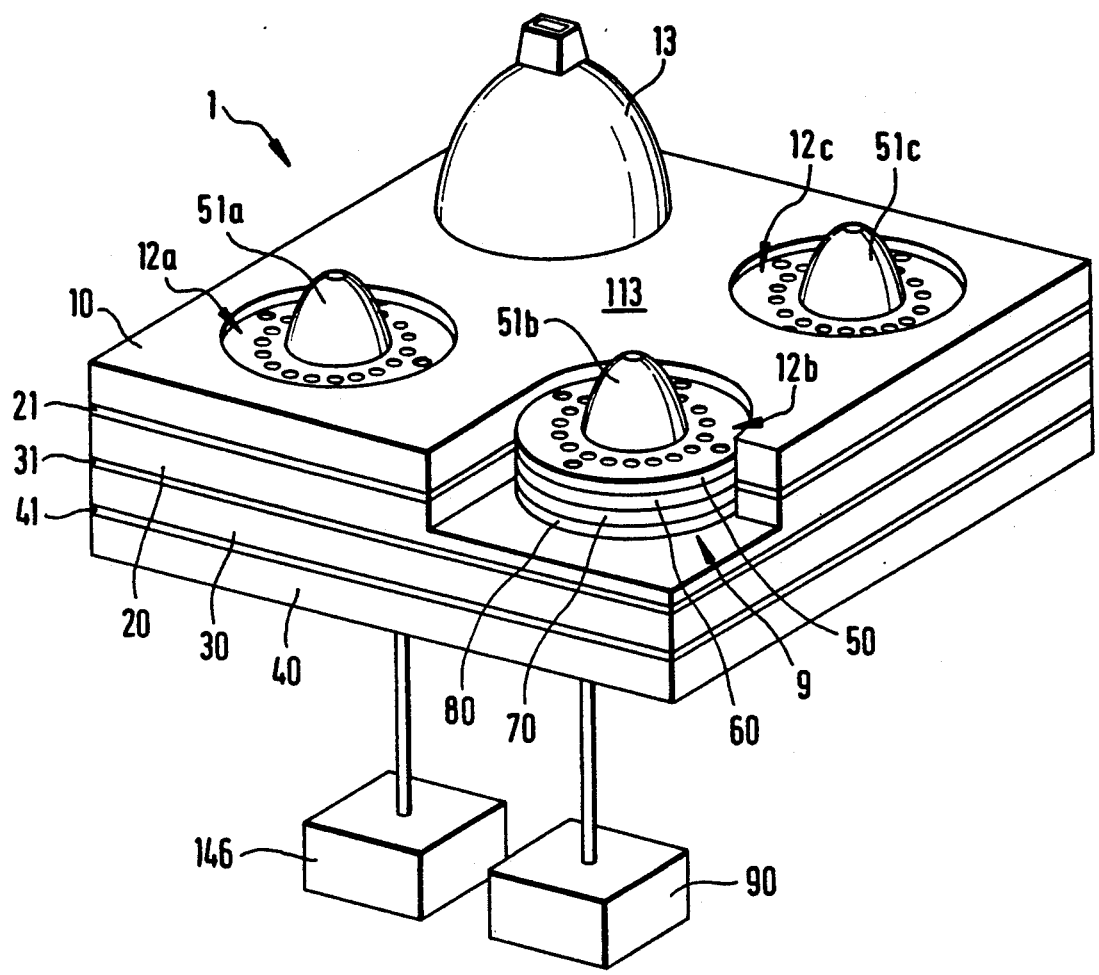
FIG. 2 is a perspective representation of a cap coating station according to another embodiment.

In FIG. 2, a cap coating station 1 with a total of four coating chambers 12a to 12d is represented, and the symmetrical gas line systems are introduced in four solid plates 10, 20, 30, 40. These solid plates are placed on top of one another, and sealing plates 21, 31 and 41 are placed between solid plates 10, 20, 30 and 40, which also can be made as elastomer coating on plates 10, 20, 30 or 40. Cap coating station 1 is connected to a common vacuum pump 90 and a common gas generator 146. As can be seen in right front coating chamber 12b partially represented in section, plate 10 is provided with a through-hole and plate 20 is provided with a pocket borehole for the formation of coating chamber 12b. Coating chambers 12a, 12c and 12d are formed in the same way. A nozzle body 9 is placed in each coating chamber 12a to 12d, which exhibits a displacer 51a to 51d each on the upper end. Displacer 51d cannot be seen in the representation shown here, since it is covered by drawn-in cap 13 to be coated.

The configuration of plates 10, 20, 30 and 40 is represented in FIGS. 4a to 7b, while nozzle body 9 is the object of FIGS. 8a to 11b.

Figure 3:
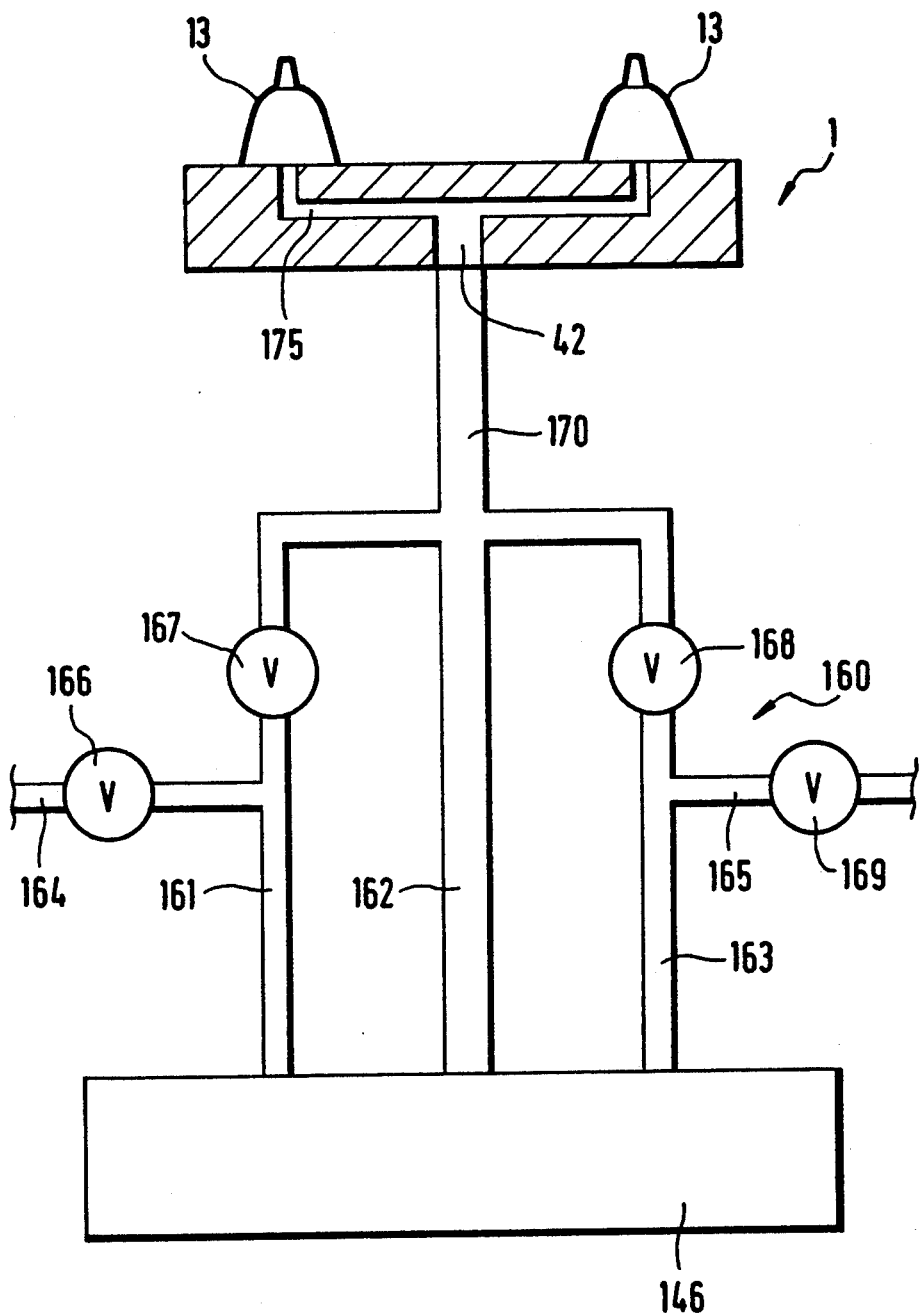
FIG. 3 is a gas supply device of a cap coating station in diagrammatic representation.

In FIG. 3, a gas distribution device 160 is provided between cap coating station 1 or gas line system 175 and gas generator 146. A separate gas line 161, 162 and 163 is respectively provided for three gases A, B and C, which are brought together in a common gas line 170, ending in gas intake duct 42 of plate 40. Since gas A is always used in combination with gas B or with gas C, gas A constantly flows through gas line 162, while gases B and C are conveyed through shutoff lines 161 and 163. To be able to add gases B and C respectively to gas A, fast-acting valves 166, 167, 168 and 169 are provided, and valves 166 and 169 are placed in bypass pipes 164 and 165. The gas mass flow of gases B and C can thus be kept as constant as that of gas A, since the gas not needed at that time in each case is conveyed by corresponding bypass pipe 164 or 165 to the pump. Bypass pipes 164, 165 exhibit the same resistance to flow as the line system as a whole, so that pressure surges are avoided in switching over.

In FIGS. 4a to 7b, plates 10, 20, 30, 40 forming cap coating station 1 as well as sealing disks 21, 31 and 41 placed between the plates are represented in top view and in section.

The direction of flow of the unburnt gas is represented by the solid-line arrows and the direction of flow of the waste gas is represented by the dotted arrows.

In FIG. 4a, the top view on upper plate 10 is represented, which exhibits four through-holes 14a to 14d for the formation of four coating chambers 12a to 12d. On the edge of boreholes 14a to 14d, sealing elements, on which caps 13 to be coated lie, are provided on surface 113 of plate 10.

Sealing plate 21 with its surface 111 first is adjacent downward to plate 10 on underside 112. Second solid plate 20 then lies against surface 110 of sealing disk 21, which exhibits four pocket boreholes 22 in the representation shown here, which are used for completing coating chambers 12a to 12d and are placed to coincide with boreholes 14a to 14d of plate 10. A section 23 of the gas exhaust duct and a section 24 of the gas intake duct are designed as through-holes in the bottom area of pocket boreholes 22. Gas intake duct section 24 ends in a duct 25 milled in surface 108, which leads to a central borehole 26. Ducts 25, which lead from central borehole 26 to individual coating chambers 12a to 12d, are placed radially. The thickness of plate 20 is to be selected so that on surface 108 the gas flow leaving borehole 26 is laminar. Determining the thickness from gas data is known.

Central borehole 26 ends in a main supply duct 27 milled on surface 109 of plate 20, which is connected with a through-hole 28. Sealing disk 21 exhibits corresponding recesses 29 in the area of coating chambers 12a to 12d.

Figure 6A:
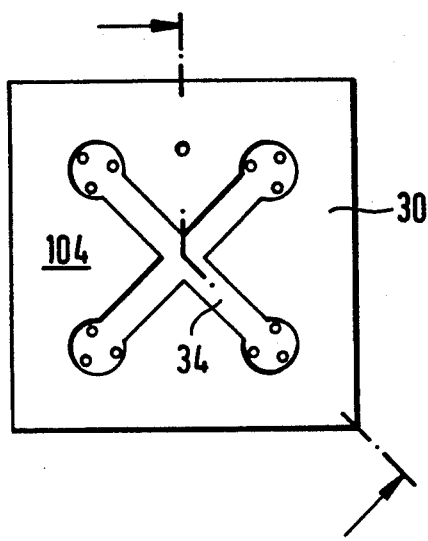
Figure 6B:
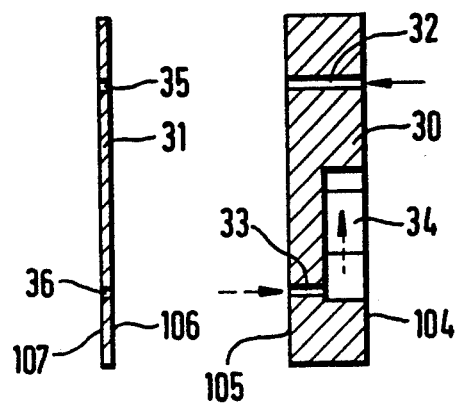

Plate 20 with its surface 108 lies on top of surface 107 of sealing disk 31, which with its surface 106 adjoins surface 105 of third solid plate 30 (see FIGS. 6a and 6b). Plate 30 has another section of common gas supply duct 32, which is designed to coincide with duct section 28 of plate 20. Section 23 of the gas exhaust duct ends in a section 33 of plate 30, which is connected with gas exhaust ducts 34 placed radially.

Figure 7A:
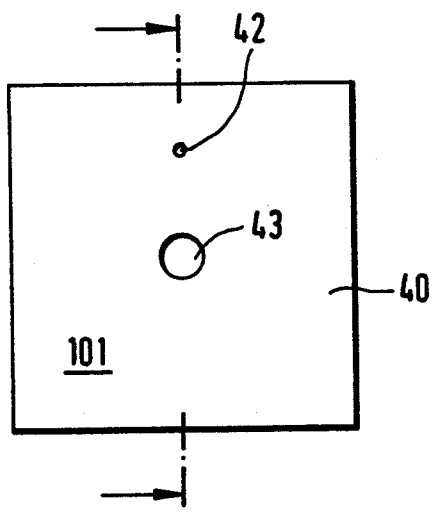
Figure 7B:
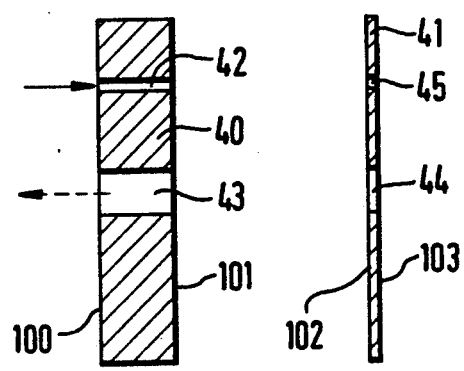
Figure 10A:
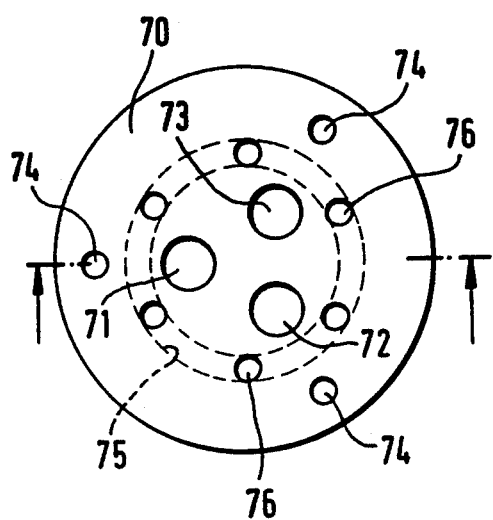
Figure 10B:
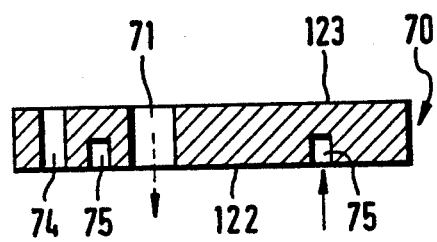
Figure 11A:
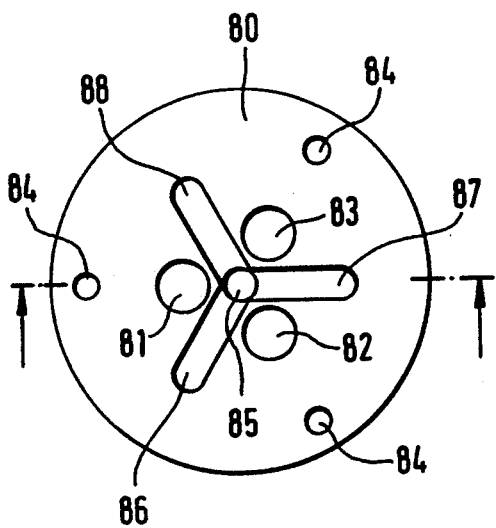
Figure 11B:
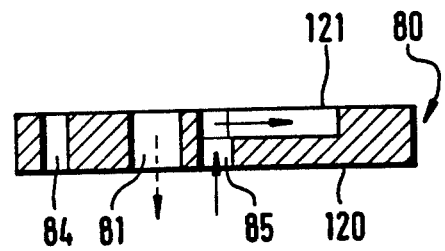

As seen in FIGS. 71 and 7b, sealing disk 41, which exhibits recesses 45 and 44, is connected downward. With surface 102 plate 40 adjoins, which is used as an end plate and exhibits a central borehole 43 for the gas exhaust and a through-hole 42 for the supply of the gas.

In FIGS. 8a to 11b, the nozzle plates forming nozzle body 9 are represented in top view and in section. In nozzle plate 80 represented in FIGS. 10a and 10b, the unburnt gas radially leaves by three ducts 86, 87, 88 from central duct 85 outward. Superimposed nozzle plate 70 distributes the unburnt gas by a circular duct 75 uniformly azimuthally and lets it flow from six connecting ducts 76 placed azimuthally equidistant from circular duct 75. This plate 70 adjoins nozzle plate 80, so that the duct ends of nozzle plate 80 lie exactly between two connecting ducts 76 of nozzle plate 70. Thus it is assured that the gas flowing through each duct of nozzle plate 80 is divided in each case into two equally large partial streams. Respective waste gas ducts 81 and 71 are installed centered vertically.

Plates 60 and 50, which are placed over plate 70, are designed in a corresponding way, and circular duct 65 is connected by connecting ducts 66 with circular duct 55 of plate 50. The unburnt gas finally flows through connecting ducts 56 into the coating chamber. The number of connecting ducts increases in each case from nozzle plate 80 to nozzle plate 70 and from the latter to nozzle plate 50.

Nozzle plate 50 has a threaded extension 53 onto which nozzle body 51 is screwed, which exhibits a central duct 52 to remove the spent reaction gas. Consequently, threaded extension 53 also has a central duct, which is continued in nozzle plate 60 lying below in ducts 67 and 61, 62 and 63. Three ducts 61, 62 and 63 are connected with gas exhaust ducts 71–73 as well as 81 to 87. Plates 50, 60, 70 and 80 are held in their predetermined position by straight pins, which are not represented, and through which in each case three boreholes 54, 64, 74, 84 are guided. Since only one very small pressure drop prevails between plates 50, 60, 70, 80, it is sufficient to make the plate surfaces very flat and smooth to avoid leakage flows.

As an alternative to threaded extension 53, a cone can also be used to receive the displacer, which has the advantage that the displacer can be quickly replaced. The advantage of the thread is the possibility of adjustment of the displacer relative to the cap surface to be coated.

Figure 12A:
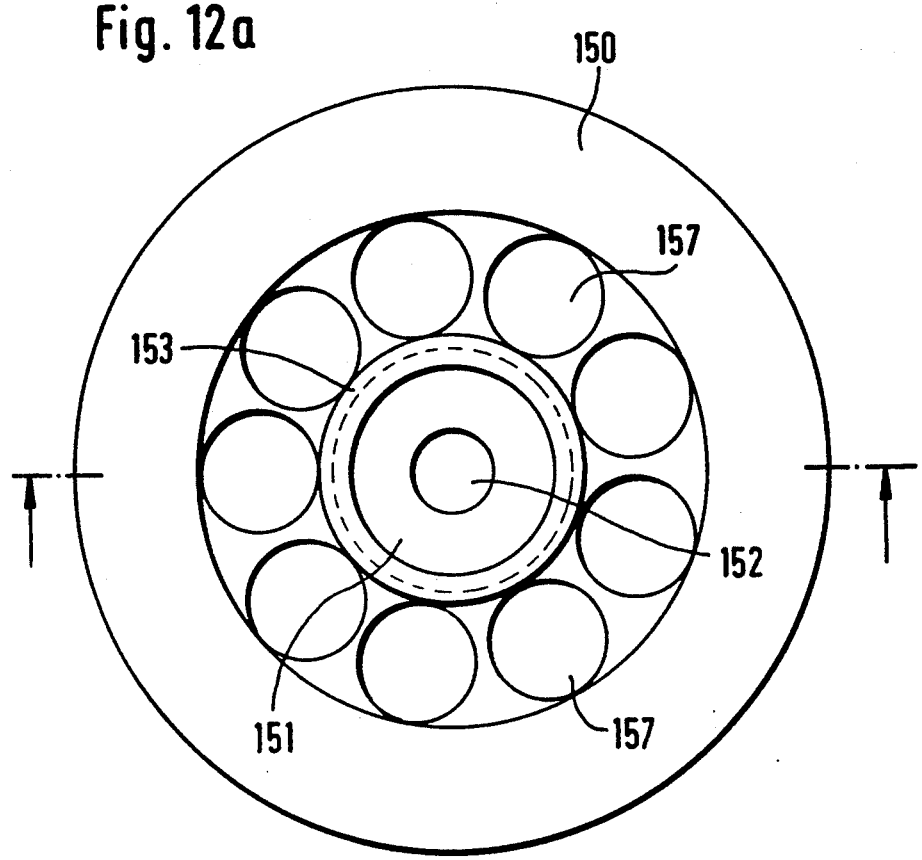
FIGS. 12a and 12b illustrate a nozzle body in bottom view and in section according to another embodiment.
Figure 12B:
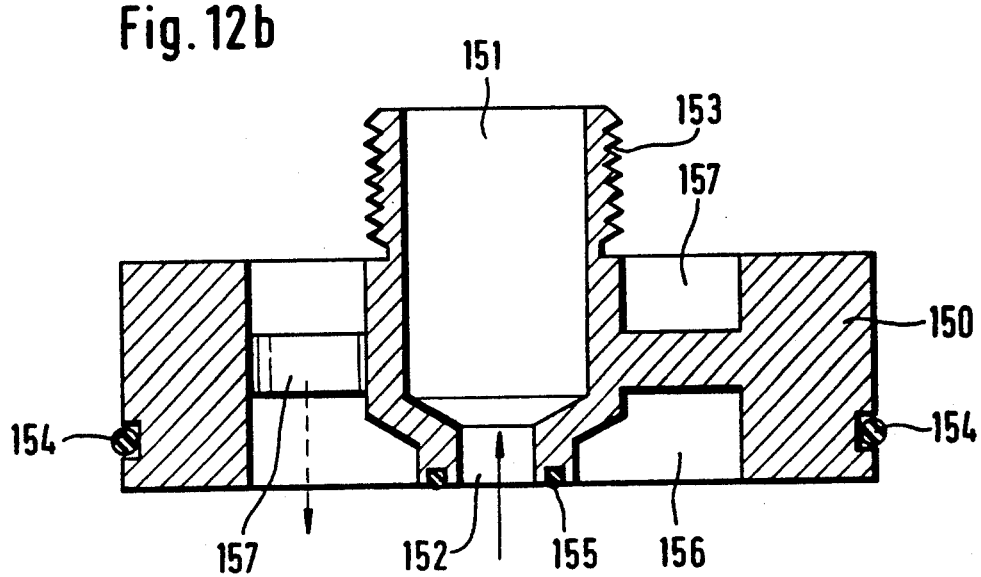

If the unburnt gas is introduced through the displacer, then nozzle body 150 is made as one piece, as can be seen in FIGS. 12a and 12b. The unburnt gas is introduced by intake duct 152 and duct 151, which ends in the central duct of the displacer (not shown). The spent gas is discharged through connecting boreholes 157, which end in circular duct 156. Nozzle body 150 exhibits sealing elements 154 and 155, thus a mixing of unburnt gas and spent gas is prevented.

Figure 13A:
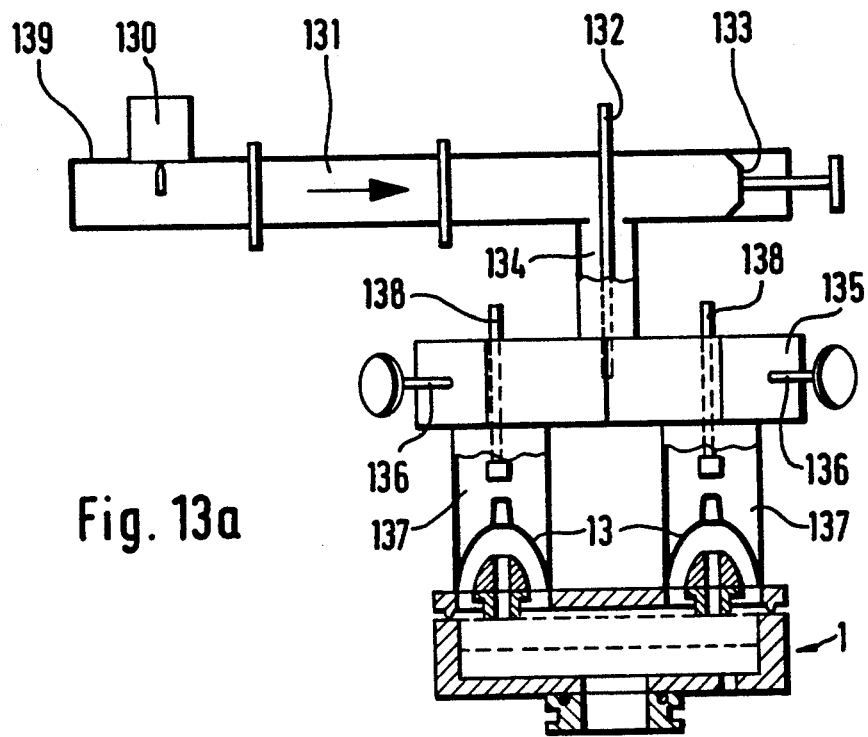
FIGS. 13a and 13b illustrate a microwave device of a cap coating station in side view and top view.
Figure 13B:
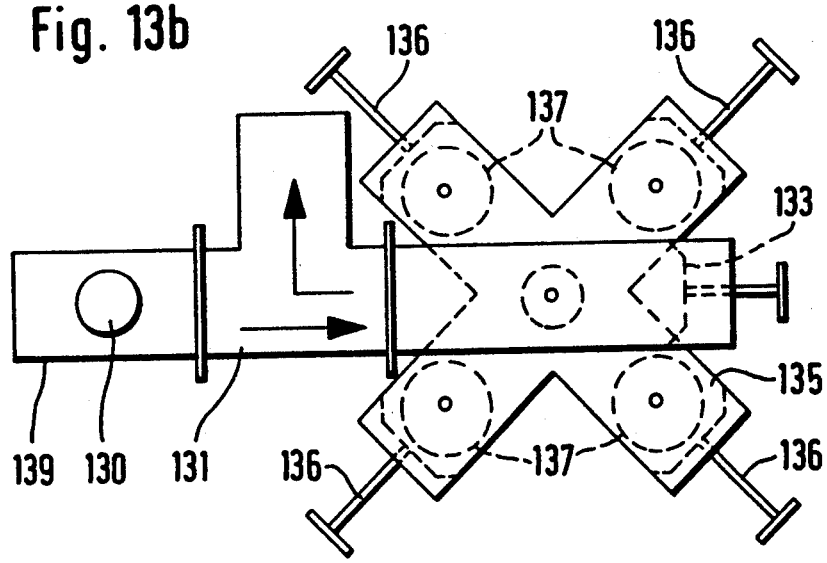

In FIG. 13a and in FIG. 13b, a cap coating station 1 with the related microwave device is represented. The microwave supply exhibits a waveguide cross 135, from which the field energy is conveyed to domes 13 to be coated by four metal pipes 137, which form coaxial microwave conductors with metal coupling pins 138. The four rectangular waveguide arms of waveguide cross 135 are closed by shortcircuiting plungers 136. Metal coupling pins 138 are provided above caps 13 to be coated. A passage from the rectangular waveguide to the coaxial conductor is provided between the cross center and short-circuiting plungers 136. Metal coupling pin 132 is the inner conductor of coaxial pipe 134. Its depth of immersion in the related outer conductor and the position of the short-circuiting plungers determine the size of the reflected microwave output, which is to be minimized. Common magnetron 130 is placed in waveguide 139. The reflected output is absorbed in one-way conductor 131.

Figure 14A:
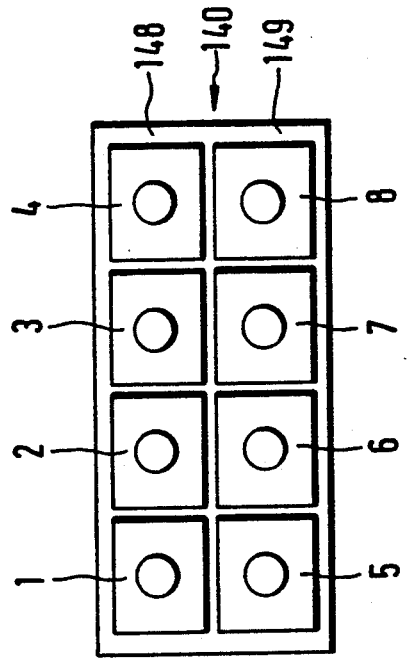
FIGS. 14a and 14b illustrate a top view and section of a cap coating unit in diagrammatic representation.

In FIG. 14a, a coating unit 140 is represented in top view, which consists of a total of eight cap coating stations 1 to 8, which are assembled in two groups 148 and 149.

Figure 14B:
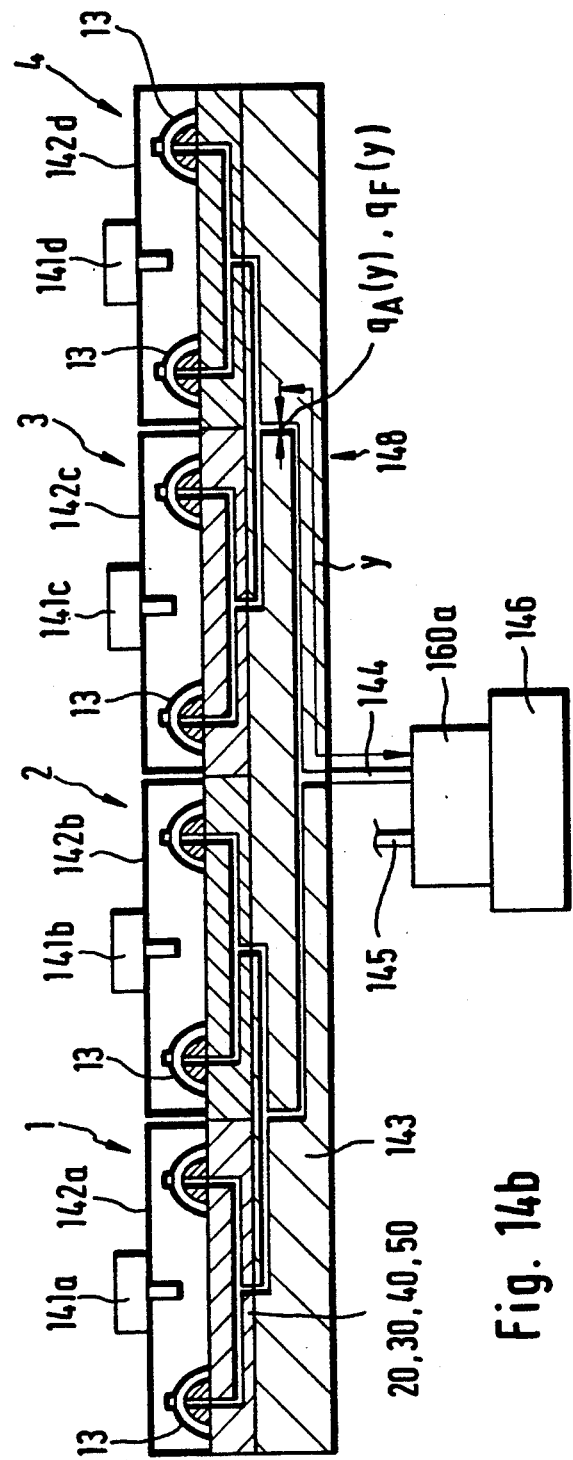

In FIG. 14b, group 148 of cap coating stations 1 to 4 is represented. Each cap coating station has a resonator box 142a, b, c, d, in the center of which a magnetron 141a, b, c, d is placed. These magnetrons 141a, b, c, d are connected to pulse generators, which are not represented. Individual cap coating stations 1 to 4 consist of four plates 20, 30, 40, 50 respectively, as is represented in FIGS. 2 and 4a to 7b.

Cap coating stations 1 to 4 are placed side by side on a distributor plate 143, which exhibits supply ducts 144 and gas discharge ducts, not represented. Also, distributor plate 143 can be composed of several plates, in which the ducts are introduced by boring and milling. Gas generator 146 with a gas distribution device 160a is designed to yield simultaneously gas types A and B to a group 148 and gas types A and C to group 149. For this purpose, gas supply lines 144 and 145 are provided, and supply line 145 leads to group 149. In the production of the interference layer systems, gases B and C are diverted to the respective other cap coating groups, when the corresponding layers have just been applied. If the length of time required for the production of the layers, for which gases B and C are necessary, differs, then the gas, which at the time is not needed is diverted into the bypass pipe (not represented). In the cap coating group, which is not being coated at the time, an oxygen plasma suitably is allowed to burn to prevent cooling of the caps. Instead of the design of groups, also all cap coating stations 1-8 can simultaneously be coated with the same gases, and the gas not used in a gas distribution device 160—similar to that shown in FIG. 2—is discharged by a bypass pipe.

Without further elaboration, it is believed that one skilled in the art can, using the preceding description, utilize the present invention to its fullest extent. The preferred specific embodiments are, therefore, to be construed as merely illustrative, and not limitative of the remainder of the disclosure in any way whatsoever.

In the foregoing, unless otherwise indicated, all parts and percentages are by weight.

The entire disclosure of all applications, patents and publications, cited above, and of corresponding German application P 41 20 176.0, are hereby incorporated by reference.

The preceding can be repeated with similar success by substituting the generically or specifically described reactants and/or operating conditions of this invention for those used herein.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. An apparatus for coating the inner surface of at least one cap-shaped substrate having a domed portion and edge with a dielectric layer system to form reflectors with a cold light mirror coating, the apparatus including a coating chamber which is formed by the cap-shaped substrate and a receiver part assembled with the layer system and connected gastight in sealing engagement with the edge of the cap-shaped substrate, the apparatus further including a gas intake duct and a gas exhaust duct connected to the coating chamber and a displacer (51) having one or more ducts to configure the gas layer to be reacted, the gas layer being reacted upon creating a plasma zone in the gas layer upon being excited with microwave energy; wherein the apparatus is configured to coat a plurality of cap-shaped substrates by providing at least two coating chamber (12a, 12b, 12c, 12d) placed side by side to form at least one cap coating station (1), the cap coating station (1) being connected by gas lines to a gas generator (146) and a vacuum pump (90), both lines being common for all coating chambers (12a–d), the gas liens for the gas supply respectively forming a symmetrical gas line system (175, 95) in which a cross sectional area $Q_A(x)$ and a cross sectional, geometrical form $Q_F(x)$ of the gas lines as a function of any selected distance (x) from the gas generator (146) or from the vacuum pump (90) are substantially the same.

2. The apparatus according to claim 1, wherein gas line systems (95, 175) are composed of precision pipes (91–93, 170–172).

3. The apparatus according to claim 1, wherein receiver parts (180) are designed as recesses (14, 22) in at least one common solid plate (10–40), in which symmetrical gas line systems (95, 175) are introduced as gas ducts (24–28, 32, 42; 23, 33, 34, 43).

4. The apparatus according to claim 3, wherein the coating chambers (12a to 12d) are placed in a circle in which gas intake ducts (24, 25, 26) and gas exhaust ducts (23, 33, 34) lead radially from the center of a cap coating station (1), and the center of which is connected respectively with a main intake duct (27, 28, 32, 42) and a main exhaust duct (43).

5. The apparatus according to claim 4, wherein at least two plates (10, 20, 30, 40) are superimposed and the gas intake ducts (24 to 48, 32, 42) and the gas exhaust ducts (23, 33, 34, 43) are formed exclusively by boring and milling in the plates.

6. The apparatus according to claim 5, wherein sealing elements (21, 31, 41) are placed between plates (10, 20, 30, 40).

7. The apparatus according to claim 5, wherein the sealing elements are sealing plates (21, 31, 41) made of a material selected from the group consisting of silicone rubber and teflon, and in which the plates have recesses (44, 45) matched at least partially to through-holes in plates (10, 20, 30, 40).

8. The apparatus according to claim 3, wherein each of the plates (10, 20, 30, 40) has at least one contacting surface (101, 104, 105, 108, 109, 112) provided with an elastomer layer.

9. The apparatus according to claim 3, wherein the plates (10, 20, 30, 40) are made of a material selected from the group consisting of metal and plastic.

10. The apparatus according to claim 3, wherein the plates (10, 20, 30, 40) are provided with a coating resistant to gas.

11. The apparatus according to claim 1, wherein the displacer (51) is placed on a nozzle body (9) and is axially adjustable thereon.

12. The apparatus according to claim 11, wherein the nozzle body (9) is made sandwichlike from at least two nozzle plates (50, 60, 70, 80), which include ducts (55, 56, 65, 66, 75, 76) for azimuthal gas flow control.

13. The apparatus according to claim 12, wherein a circular duct (55, 65, 75) is provided in each nozzle plate (50, 60, 70, 80), which is connected with another circular duct (55, 65, 75) of the adjacent nozzle plate by connecting ducts (56, 66, 76), and the connecting ducts of adjacent nozzle plates are placed offset with respect to one another.

14. The apparatus according to claim 12, wherein the number of connecting ducts (56, 66, 76) increases from nozzle plate to nozzle plate in the direction of the cap-shaped substrate (13).

15. The apparatus according to claim 1, wherein a gas distribution device (160) is placed between the symmetrical gas line system (175) and the gas generator (146).

16. The apparatus according to claim 1, wherein the plasma zone is excited by a microwave device in proximity with the cap coating station (1), which microwave device comprises a magnetron (130, 141) with a pulse generator.

17. The apparatus according to claim 16, wherein over the cap-shaped substrates (13), there is positioned a resonator box (142) that is lowered on a plurality of cap coating stations (1 to 8), the resonator box having a magnetron (141) located in a center portion thereof.

18. The apparatus according to claim 16, wherein there is placed over the cap-shaped substrates (13), a waveguide in the form of a cross (135) with metal cylinders (137) that can be lowered on cap coating station (1), the waveguide being interconnected by connecting waveguides (131, 134, 139) to the magnetron (130).

19. The apparatus according to claim 1, wherein the plasma zone is excited by means including a microwave device assigned to each coating chamber (12a-d), which respectively comprises a magnetron with a pulse generator.

20. An apparatus used to coat inner surfaces of cap-shaped substrates, wherein at least two cap coating stations (1 to 8) are connected to a common gas generator (146) or common vacuum pump (90) by gas lines, the gas liens also forming a symmetrical gas line system, and the gas lines each having a cross-sectional area $q_A(y)$ and a cross-section geometrical form $q_F(y)$ each of which are functions of distance (y) from the gas generator or from the vacuum pump which are substantially the same; the cap coating stations (1 to 8) being placed side by side on a one-part or multipart solid distributor plate (143) in which the symmetrical gas line systems are introduced as supply ducts (144, 145) and suction ducts.

21. The apparatus according to claim 20, wherein the supply ducts (144, 145) and the suction ducts are produced exclusively by boring and milling the distributor plate (143).

22. The apparatus according to claim 20, wherein the cap coating stations (1 to 8) are combined into two groups (148, 149), and each group (148, 149) is connected by separate ducts (144, 145) to the gas generator (146), which supplies both cap coating groups (148, 149) with various gas mixtures.

23. The apparatus according to claim 20, wherein a gas distribution device (160a) is placed in supply ducts (144, 145) for feeding cap coating groups (148, 149) alternately with the gas mixtures.

* * * * *

UNITED STATES PATENT AND TRADEMARK OFFICE
CERTIFICATE OF CORRECTION

PATENT NO. : 5,324,361
DATED : June 28, 1994
INVENTOR(S) : Heinz-Werner ETZKORN et al.

It is certified that error appears in the above-indentified patent and that said Letters Patent is hereby corrected as shown below:

Claim 1, Column 10, Line 47:   Delete "liens" and insert
- - lines - - .

Signed and Sealed this

Sixth Day of December, 1994

Attest:

BRUCE LEHMAN

Attesting Officer        Commissioner of Patents and Trademarks